United States Patent
Li et al.

(10) Patent No.: US 10,333,516 B2
(45) Date of Patent: Jun. 25, 2019

(54) OPTICAL RECEIVERS

(71) Applicant: HEWLETT PACKARD ENTERPRISE DEVELOPMENT LP, Houston, TX (US)

(72) Inventors: Cheng Li, Palo Alto, CA (US); Kunzhi Yu, Palo Alto, CA (US); Marco Fiorentino, Mountain View, CA (US); Raymond G Beausoleil, Seattle, WA (US)

(73) Assignee: Hewlett Packard Enterprise Development LP, Houston, TX (US)

(*) Notice: Subject to any disclaimer, the term of this patent is extended or adjusted under 35 U.S.C. 154(b) by 0 days.

(21) Appl. No.: 15/749,370

(22) PCT Filed: Jul. 31, 2015

(86) PCT No.: PCT/US2015/043078
§ 371 (c)(1),
(2) Date: Jan. 31, 2018

(87) PCT Pub. No.: WO2017/023240
PCT Pub. Date: Feb. 9, 2017

(65) Prior Publication Data
US 2018/0234096 A1   Aug. 16, 2018

(51) Int. Cl.
*H04B 10/00* (2013.01)
*H03K 17/78* (2006.01)
(Continued)

(52) U.S. Cl.
CPC ............ *H03K 17/78* (2013.01); *G01J 1/44* (2013.01); *H03F 3/082* (2013.01); *H03K 17/941* (2013.01); *H04B 10/6931* (2013.01)

(58) Field of Classification Search
USPC .................................................. 398/202–214
See application file for complete search history.

(56) References Cited

U.S. PATENT DOCUMENTS 4,415,803 A * 11/1983 Muoi ................. H03F 1/08
250/214 A
4,565,974 A * 1/1986 Smoot ............... H03G 3/3084
330/279

(Continued)

FOREIGN PATENT DOCUMENTS

WO  WO-2013166522 A1  11/2013

OTHER PUBLICATIONS

C.Juang et al., 'Transimpedance amplifiers using three cascade variable inverter gain stages', In: Analog Integrated Circuits and Signal Processing, Sep. 11, 2006, vol. 49, pp. 299-302.

(Continued)

*Primary Examiner* — Agustin Bello
(74) *Attorney, Agent, or Firm* — Hewlett Packard Enterprise Patent Department

(57) ABSTRACT

In one example, a device includes a photodetector to generate an electrical signal in response to an optical signal and a transimpedance amplifier unit to receive the electrical signal. In one example, the transimpedance amplifier unit may include a first inverter unit, a second inverter unit coupled to the first inverter unit, and a third inverter unit coupled to the second inverter unit. In one example the third inverter unit may include a feedback resistor and a first n-type transistor in parallel to the feedback resistor, where the first n-type transistor is to provide a variable gain of the third inverter unit.

10 Claims, 6 Drawing Sheets

(51) Int. Cl.
*H03F 3/08* (2006.01)
*G01J 1/44* (2006.01)
*H03K 17/94* (2006.01)
*H04B 10/69* (2013.01)

(56) References Cited

U.S. PATENT DOCUMENTS

| | | | | |
|---|---|---|---|---|
| 4,731,590 | A * | 3/1988 | Saari | H04B 3/04 330/278 |
| 5,532,471 | A * | 7/1996 | Khorramabadi | H03F 3/082 250/214 A |
| 5,602,510 | A * | 2/1997 | Bayruns | H03F 3/082 330/110 |
| 5,801,867 | A | 9/1998 | Geller et al. | |
| 6,720,826 | B2 * | 4/2004 | Yoon | H03F 3/082 250/214 A |
| 6,720,830 | B2 | 4/2004 | Andreou et al. | |
| 6,737,924 | B1 * | 5/2004 | Paillet | H03F 1/083 330/264 |
| 7,236,056 | B2 * | 6/2007 | Chang | H03F 3/45973 250/214 AG |
| 7,245,179 | B2 * | 7/2007 | Chang | H03F 1/08 250/206 |
| 7,305,190 | B2 * | 12/2007 | Mayampurath | H03F 1/34 398/202 |
| 8,023,835 | B2 | 9/2011 | Kim et al. | |
| 8,274,335 | B1 | 9/2012 | Chatwin | |
| 8,509,629 | B2 * | 8/2013 | Zou | H03F 3/082 330/277 |
| 8,514,015 | B2 * | 8/2013 | Chen | H03F 1/223 330/311 |
| 8,731,412 | B2 | 5/2014 | Ito et al. | |
| 8,841,969 | B2 * | 9/2014 | Lee | H03G 1/0082 330/279 |
| 9,065,407 | B2 * | 6/2015 | Zou | H03G 3/004 |
| 9,215,114 | B2 | 12/2015 | Emami-Neyestanak | |
| 10,044,328 | B2 * | 8/2018 | Khaw | H03F 3/082 |
| 2002/0153949 | A1 | 10/2002 | Yoon | |
| 2003/0161640 | A1 | 8/2003 | Kimura | |
| 2003/0214353 | A1 * | 11/2003 | Yoon | H03F 3/082 330/69 |
| 2003/0218508 | A1 * | 11/2003 | Chiou | H03F 3/087 330/308 |
| 2004/0129862 | A1 * | 7/2004 | McTaggart | H03F 3/087 250/214 A |
| 2006/0071710 | A1 * | 4/2006 | Chang | H03F 1/08 330/86 |
| 2006/0261895 | A1 * | 11/2006 | Kocaman | H03G 3/001 330/279 |
| 2006/0290432 | A1 * | 12/2006 | Chang | H03F 3/45973 330/308 |
| 2007/0071455 | A1 * | 3/2007 | Margalit | H03G 3/3084 398/202 |
| 2007/0222511 | A1 * | 9/2007 | Chang | H03F 1/08 330/86 |
| 2008/0309407 | A1 * | 12/2008 | Nakamura | H03F 1/08 330/253 |
| 2009/0110409 | A1 * | 4/2009 | Zou | H03F 3/082 398/208 |
| 2009/0163784 | A1 * | 6/2009 | Sarpeshkar | A61B 5/14551 600/322 |
| 2010/0086315 | A1 * | 4/2010 | Tanaka | H04B 10/07955 398/208 |
| 2012/0217381 | A1 * | 8/2012 | Tatsumi | H03F 3/087 250/214 A |
| 2012/0249240 | A1 * | 10/2012 | Chatwin | H03G 3/3084 330/131 |
| 2013/0135054 | A1 * | 5/2013 | Ito | H03F 3/08 330/308 |
| 2013/0188965 | A1 | 7/2013 | Afriat et al. | |
| 2013/0216241 | A1 * | 8/2013 | Proesel | G01J 1/46 398/213 |
| 2014/0097901 | A1 * | 4/2014 | Sano | H03G 3/30 330/278 |
| 2014/0185661 | A1 * | 7/2014 | Chang | H04L 27/01 375/232 |
| 2014/0255037 | A1 * | 9/2014 | Shang | H04L 27/01 398/115 |
| 2014/0306760 | A1 * | 10/2014 | Piepenstock | H03G 1/007 330/261 |
| 2015/0071654 | A1 * | 3/2015 | Morita | H03F 1/0277 398/182 |
| 2015/0155951 | A1 * | 6/2015 | Noda | H03G 3/3084 398/202 |
| 2016/0006395 | A1 * | 1/2016 | Kim | H03F 1/0205 330/261 |
| 2016/0142179 | A1 | 5/2016 | Fludger et al. | |
| 2016/0149548 | A1 * | 5/2016 | Gorecki | H03G 1/0035 330/254 |
| 2018/0026597 | A1 * | 1/2018 | Barabas | H03F 1/086 330/278 |
| 2018/0234096 | A1 * | 8/2018 | Li | H03K 17/78 |

OTHER PUBLICATIONS

Chin, P. et al., "Analysis and Design of High Performance and Low Power Current Mode Logic CMOS", downloaded Jul. 31, 2015 from bwrcs eecs berkeley edu/Classes/icdesign/ee241_s06/.../ChinSuZhong.doc, 3 pages.

Heydari, P., "Design of Ultrahigh-Speed Low Voltage CMOS CML Buffers and Latches," IEEE Transactions on Very Large Scale Integration (VLSI) Systems, vol. 12, No. 10, Oct. 2004 pp. 1081-1093.

Kern, A.M. et al.: "CMOS Circuits for VCSEL-Based Optical IO"; Aug. 16, 2007; https://www.google.co.in/url?sa=t&rct=j&q=&esrc=s&source=web&cd=7&cad=rja&uact=88.

Moghimi R., "Amplifiers as Comparators?", ADI—Analog Dialog, vol. 37, Apr. 2003, pp. 1-10.

Mohamed, A. et al.: "An integrated optical receiver for 2.5Gbit/s using 4-PAM signaling"; Dec. 19-22, 2010; http://ieeexplore.ieee.org/stamp/stamp.jsp?arnumber=5696210.

PCT International Search Report issued in Appl. No. PCT/US2015/043078; dated May 30, 2016; 11 pages.

EP Search Report cited in EP Appl. No. 15900509.9 dated Nov. 7, 2018; 19 pages.

Ingels, M., et al; "A 1-Gb/s, 0.7-um CMOS Optical Receiver with Full Rail-to-Rail Output Swing"; Jul. 7, 1999; 7 pages.

Juang, C., et al; "Transimpedance amplifiers using three cascade variable inverter gain stages"; Oct. 22, 2005; 4 pages.

Triantafyllidis, M.; "Adaptive Automatic; Transmit Power Control": (Research Paper); Department of Electrical and Information Technology, Lund University, in Cooperation with Ericsson AB, Jun. 2014; 96 pages.

Youn, J.S. et al., "An integrated 12.5-Gb/s Optoelectronic Receiver with a Silicon Avalanche Photodetector in Standard SiGe BiCMOS Technology," (Research Paper), Optics Express 20.27, Dec. 2012, pp. 28153-28162.

Yu et al.; "56 Gb/s PAM-4 Optical Receiver Frontend in an Advanced FinFET Process"; IEEE 58th International Midwest Symposium on Circuits and Systems (MWSCAS); Aug. 2015; pp. 1-4.

* cited by examiner

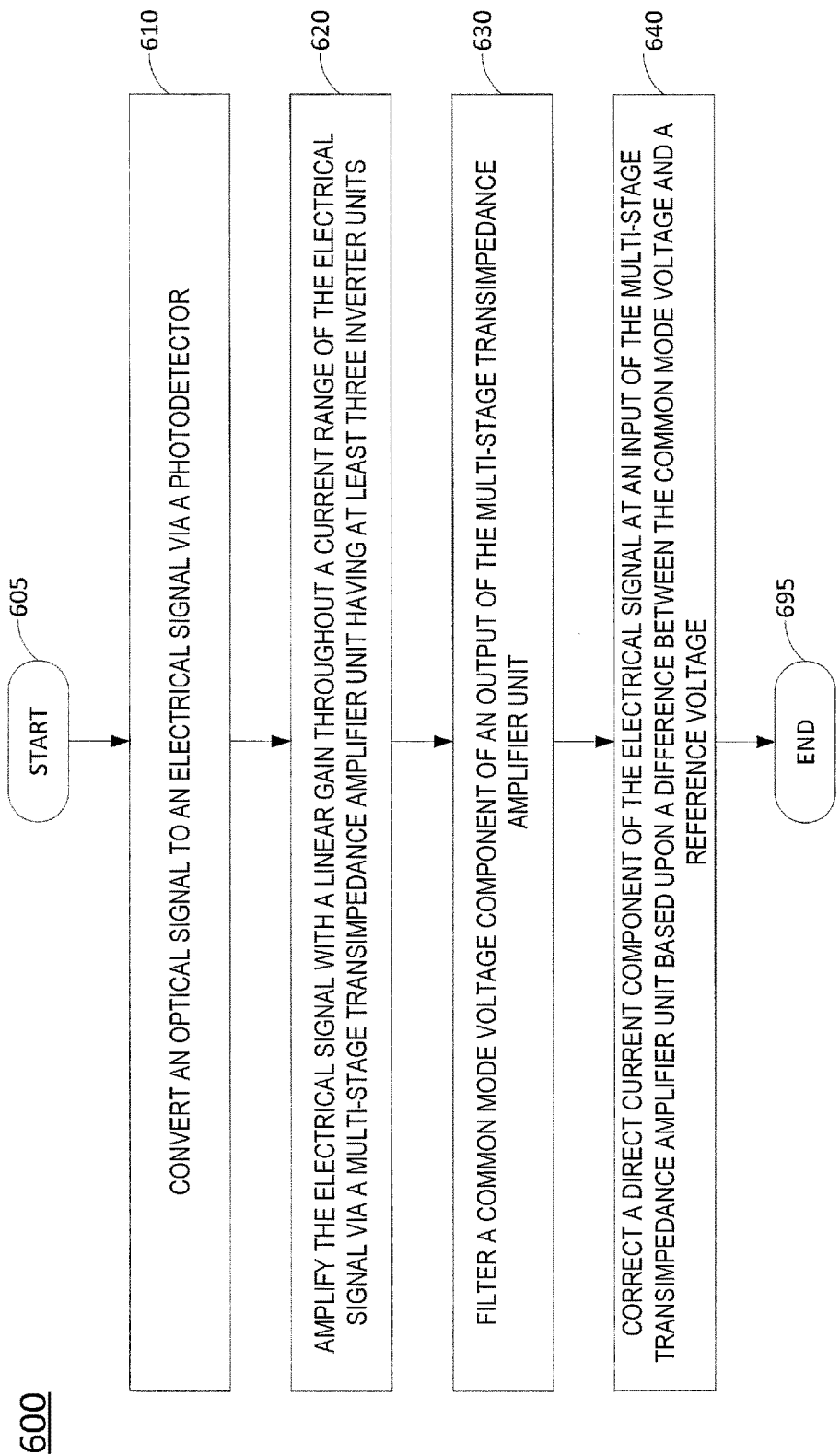

OPTICAL RECEIVERS

STATEMENT OF GOVERNMENT RIGHTS

This invention was made with Government support under Agreement No. H98230-14-3-0011. The Government has certain rights in this invention.

BACKGROUND

Various formats may be utilized for optical signal modulation in silicon photonics, including, return-to-zero (RZ) and non-return-to-zero (NRZ) on-off keying (OOK), RZ and NRZ differential phase shift keying (DPSK), quadrature phase shift keying (QPSK), and so forth. A four-level pulse amplitude modulation (PAM-4) format may also be utilized in complementary metal-oxide-semiconductor (CMOS) based integrated circuits for optical signal modulation.

BRIEF DESCRIPTION OF THE DRAWINGS

FIG. 6 illustrates a flowchart of an example method of the present disclosure to process an optical signal.

DETAILED DESCRIPTION

Figure 1:
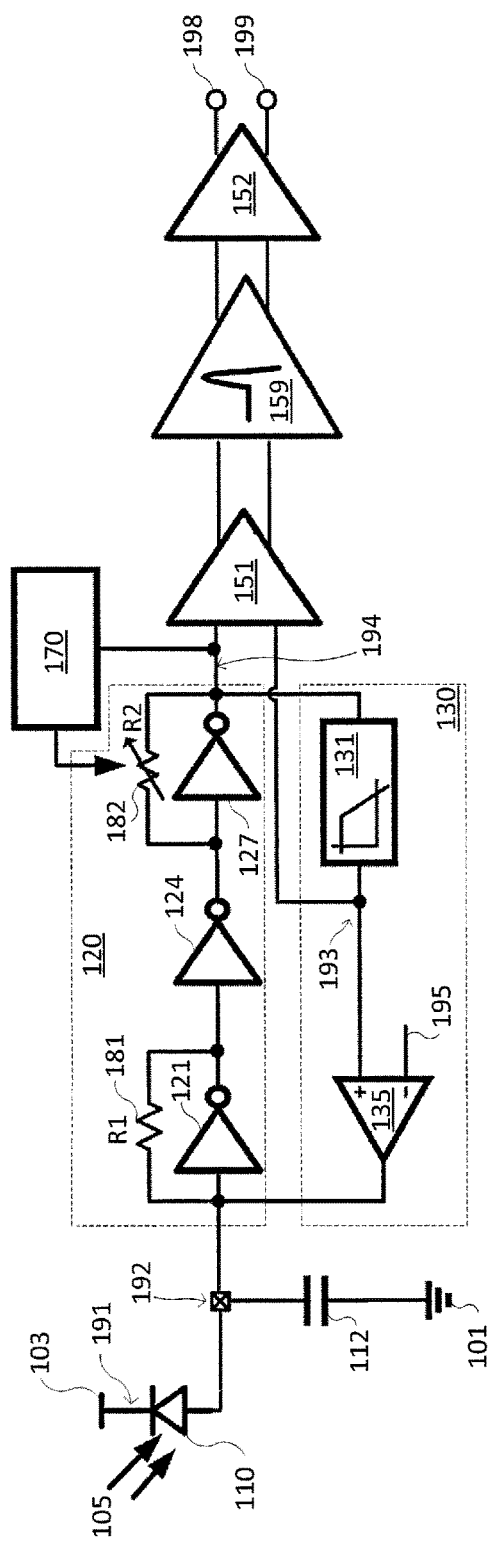
FIG. 1 illustrates an example device of the present disclosure.

In one example, the present disclosure describes a device that may include a transimpedance amplifier unit having a first inverter unit, a second inverter unit coupled to the first inverter unit, and a third inverter unit coupled to the second inverter unit. In one example, the third inverter unit may include a feedback resistor and a first n-type transistor in parallel to the feedback resistor, where the first n-type transistor is to provide a variable gain of the third inverter unit.

In another example, the present disclosure describes a device that may include a photodetector to receive an optical signal and to convert the optical signal to an electrical signal, and a transimpedance amplifier unit having at least three inverters to amplify the electrical signal with a linear gain throughout a current range of the electrical signal. The device may also include an offset correction circuit coupled to the transimpedance amplifier unit, to correct a direct current component of the electrical signal, and an automatic gain control circuit coupled to the transimpedance amplifier unit, to control a variable gain of at least one of the at least three inverter units of the transimpedance amplifier unit and to prevent the at least three inverter units of the transimpedance amplifier unit from operating in a saturation region.

In another example, the present disclosure describes a method for processing an optical signal. The method may include converting the optical signal to an electrical signal via a photodetector, and amplifying the electrical signal with a linear gain throughout a current range of the electrical signal via a transimpedance amplifier unit having at least three inverter units. The method may further include filtering a common mode voltage component of an output of the transimpedance amplifier unit, and correcting a direct current component of the electrical signal at an input of the transimpedance amplifier unit based upon a difference between the common mode voltage component and a reference voltage.

These and other aspects of the present disclosure are discussed in greater detail below in connection with the example figures and accompanying description.

In one example, the present disclosure comprises an optical receiver analog front-end circuit. The optical receiver may be for use in connection with four-level pulse amplitude modulation (PAM-4) optical signals, e.g., in an optical integrated circuit, or a photonic integrated circuit. PAM-4 optical signals may result in greater peak-to-peak voltage swings in the electrical domain than non-return-to-zero on-off keying (NRZ-OOK) or other two-level modulation schemes. In one example, the optical receiver may include a transimpedance amplifier (TIA) with at least three inverter stages, with resistive feedback in the first and third stages. The TIA may function as an amplifier for small signals. The overall gain of the TIA is controlled by an automatic gain control (AGC) circuit to avoid saturation of the TIA by large input optical power. For example, PAM-4 optical signals may be converted to electrical signals via a photodetector. The conversion between optical power level (or intensity) and the electrical current is essentially linear. However, PAM-4 optical signals may result in electrical signals that can exceed the linear operating regions of the transistors in the TIA, thereby causing the output of the optical receiver analog front-end circuit to be distorted. In one example, the AGC circuit may control the gain of the TIA to maintain a uniform gain over the range of input optical power and over the range of voltages in the electrical domain. The optical receiver analog front-end circuit may also include a direct current (DC) offset correction circuit, as described in further detail below. In one example, the analog receiver front-end circuit may also include a continuous-time linear equalization unit (CTLE) cascaded after the TIA with at least one common-mode logic (CML) buffer for improved sensitivity and bandwidth.

The use of multi-level encoding, e.g., PAM-4 instead of two-level encoding, allows the use of a smaller bandwidth optical receiver. For example, four-level encoding provides two transmitted bits per symbol and increases the throughput at a given bandwidth. However, the circuit complexity increases since the receiver front-end is expected to deliver a linear amplification of the input multi-level current signals over a large dynamic range. In addition, over-peaking in the frequency domain may reduce the multi-level signal eye opening and degrade the bit error rate (BER) performance.

For multi-level encoding techniques to offer a comparable BER performance over two-level encoding, the signal-to-noise ratio (SNR) at the analog receiver front-end may need to be higher than what is acceptable for two-level encoding to overcome loss due to separation between signal levels. In this regard, the present disclosure provides an optical receiver front-end circuit that provides a linear gain at wideband, high receiver sensitivity, and improved noise performance. It should be noted that examples of the present disclosure are primarily described herein in connection with the use of PAM-4 signals. In this mode of operation, data rates of up to 56 Gb/s per channel have been demonstrated. However, it should also be noted that examples of the present disclosure may be used in connection with any wideband signals, e.g., with wider peak-to-peak optical intensity levels, and greater peak-to-peak currents and greater peak-to-peak voltages in the electrical domain as compared to NRZ-OOK and the like. This may include two-level encoding, three-level encoding, four-level encoding, and so forth.

FIG. 1 illustrates an example device 100 of the present disclosure. In one example, the device 100 may comprise an optical receiver front-end circuit having a photodiode 110 for receiving an input optical signal 105 via an input port 191. In one example, the input port 191 may comprise a waveguide formed within an integrated circuit, e.g., a silicon waveguide. The photodiode may be reverse biased with respect to a supply voltage 103. A capacitor 112 connected to ground 101 is illustrated to represent the parasitic capacitance of the photodiode 110 and an input metal pad. In one example, the capacitance may be approximately 80 femto-Farads. Device 100 may include a transimpedance amplifier (TIA) unit 120 having at least three "stages" of inverter units 121, 124, and 127. In one example, transimpedance amplifier unit 120 includes resistors 181 and 182 to provide resistive feedback in the first stage (inverter unit 121) and third stage (inverter unit 127). In one example, the inverter units 121, 124, and 127 are biased around the trip point of the transistors comprising the inverter units 121, 124, and 127 for more effective gain. As illustrated in FIG. 1, device 100 also includes an automatic gain control circuit 170 comprising a peak detector to adjust the resistive feedback of the third stage, and to thereby lower the gain of inverter 127 and the overall gain of the TIA unit 120.

Device 100 may also include an offset correction circuit 130 comprising a low-pass filter 131 and an operational amplifier (op-amp) 135. In one example, the offset correction circuit 130 is for subtracting the average photocurrent from the input node 192 and for maintaining a voltage level, e.g., a bias around the trip point, at the input node 192. In one example, the cutoff frequency of the low-pass filter 131 may be set to 150 KHz, and the signal at node 193 may comprise a common-mode (DC) voltage portion of the signal at input node 192. Operational amplifier 135 may compare the signal at node 193 to a reference voltage 195, which may comprise a desired DC bias. As mentioned above, in one example, this may comprise one half of the supply voltage 103. In one example, operational amplifier 135 does not include feedback, such that the open loop gain goes to the supply voltage level.

In one example, device 100 may also include a CML buffer 151. CML buffer 151 may comprise a small-gain CML buffer that may be used to convert a single-ended output from the TIA unit 120 at the TIA output node 194 to a differential output. For instance, in one example CML buffer 151 may have a gain of 3 decibels (dB) with a bandwidth of 40 gigahertz (GHz). A common-mode, direct current (DC) input to the CML buffer 151 may be provided by the low-pass filter 131. For example, the signal at node 193 may comprise a common-mode voltage portion of the signal at input node 192. The CML buffer 151 may also be cascaded with a continuous-time linear equalizer (CTLE) 159 for improved sensitivity and bandwidth.

Another CML buffer 152 may also be provided following the CTLE 159. In one example, CML buffer 152 may have a same gain and bandwidth as CML buffer 151. For instance, the gain of CML buffer 152 may be 3 dB with a bandwidth of 40 GHz. However, at CML buffer 152, shunt-inductive peaking may be used at the final stage to drive the relatively large parasitic capacitance (approximately 40 femto-Farads) of a following slicer bank. In one example, CML buffer 152 provides a differential output signal via positive and negative output ports 198 and 199 respectively. Since the signal quality for multi-level encoded signals is sensitive to the phase and group delay variations, in one example the inductive peaking of the CML buffers 151 and 152, and the equalization of CTLE 159 are controlled to avoid frequency response over-peaking, which can deteriorate the multi-level signal eye opening and jitter performance. In other words, the inductive peaking and equalization may be selected to provide a broadband flat frequency response and low deterministic jitter, as well as low group delay variation.

Figure 2:
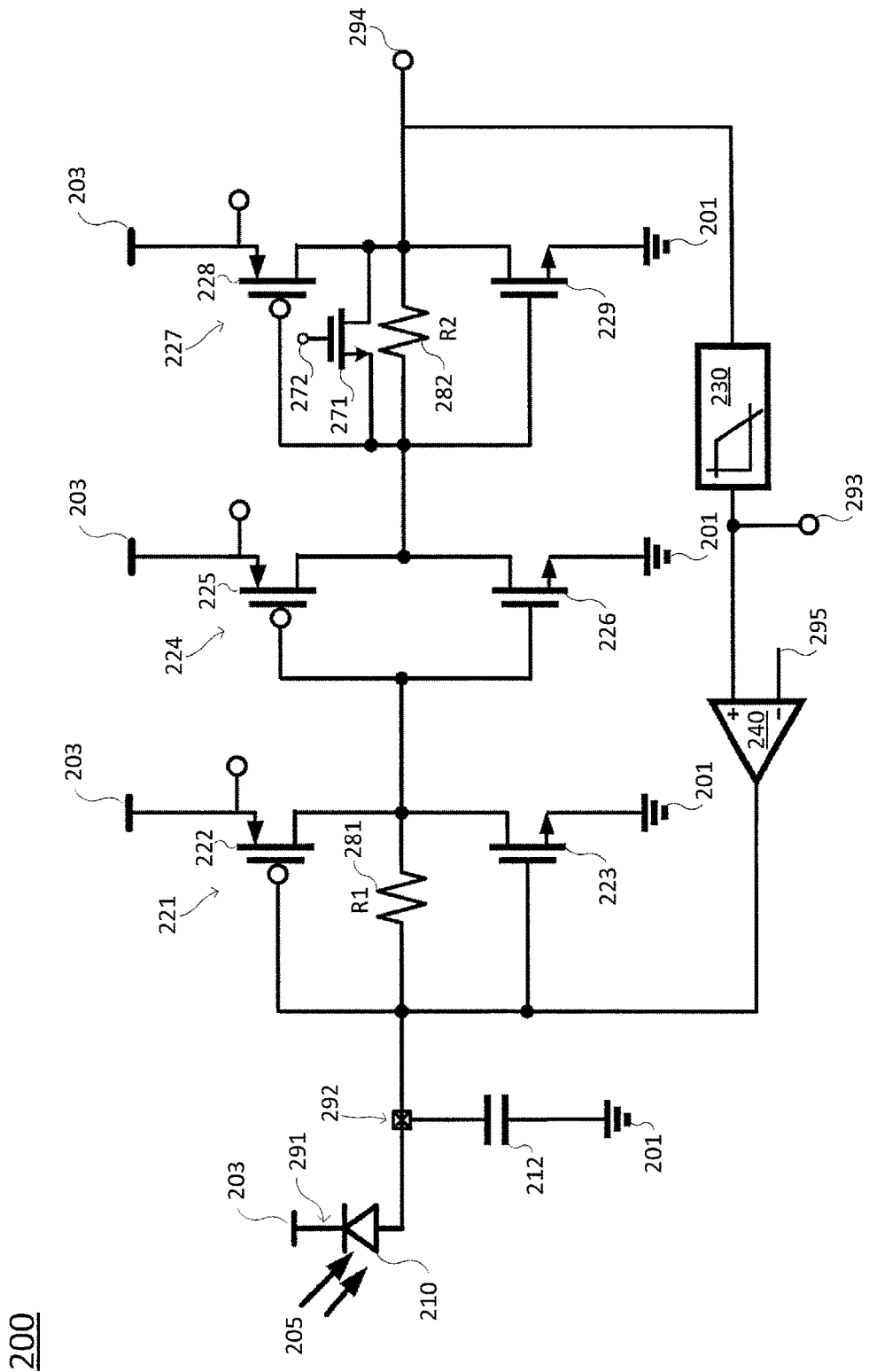
FIG. 2 illustrates an example device, or circuit of the present disclosure.

FIG. 2 illustrates an example circuit 200 of the present disclosure. In one example, circuit 200 may include portions which represent TIA unit 120, offset control unit 130, photodiode 110, and capacitor 112 of the device 100 of FIG. 1. As shown in FIG. 2, circuit 200 may include a photodiode 210 for receiving an optical signal 205 via input port 291, e.g., a silicon waveguide, and converting the optical signal 205 to an electrical signal at TIA input node 292. In one example, the photodiode 210 may be reverse biased with respect to a supply voltage 203. FIG. 2 also illustrates a capacitor 212 connected to ground 201, to represent the parasitic capacitance of the photodiode 210. Circuit 200 may also include inverter units 221, 224, and 227, where each inverter unit comprises a transistor pair, e.g., p-type transistors 222, 225, and 228 paired with n-type transistors 223, 226, and 229, respectively. In one example, the transistors of the devices and circuits of the present disclosure (e.g., in FIG. 1 and in additional figures) may comprise CMOS transistors. Alternatively or in addition, the transistors may comprise fin-field effect transistor (Fin-FET) devices. The p-type transistors 222, 225, and 228 may be connected to a supply voltage 203, while the n-type transistors 223, 226, and 229 may be connected to ground 201. The first stage, e.g., inverter unit 221, includes a feedback resistor 281 (also referred to as "R1"). The third stage, e.g., inverter unit 227, includes a feedback resistor 282 (also referred to as "R2").

As illustrated in FIG. 2, an additional n-type transistor 271 is connected in parallel with resistor 282 to provide automatic gain control (AGC). For example, when "off," the n-type transistor 271 appears to have infinite resistance. When a sufficient voltage is applied to the gate of n-type transistor 271 to exceed the trip point, the transistor turns on and allows current to flow from the drain to the source. Thus, the n-type transistor 271 appears as a resistor in parallel with resistor 282, thereby lowering the gain of the inverter unit 227 and the overall gain from the TIA input node 292 to the TIA output node 294. In one example, the overall gain from the TIA input node 292 to the TIA output node 294 is designed at 66 decibel·ohms.

The inverter units 221, 224, and 227 may be biased around the trip-point of the transistors for more effective gain with an offset control loop that subtracts the average photocurrent from the input node 292. In one example, the transimpedance bandwidth is set to 22 gigahertz (GHz) to guarantee a fast transition time, e.g., for up to 28 gigabaud (G baud) or greater PAM-4 signals, without including extra noise into the passband. For the given total input capacitance (e.g., 80 femtofarads (fF)) and a target bandwidth (e.g., 22 GHz) the input impedance can be determined, which also give an indication of the feedback resistances (for resistors 281 and 282) and transconductances (for p-type transistors 222, 225, and 228, and n-type transistors 223, 226, and 229) that can be utilized.

In one example, the DC transimpedance gain and the input impedance can be calculated according to Equation 1 and Equation 2, where $Z_T$ is the DC transimpedance, $Z_{in}$ is the input impedance, $R_1$ is the resistance of resistor 281, $R_2$ is the resistance of resistor 282, $A_1$ and $A_3$ are the open-loop gains for inverter units 221 and 227, respectively, and $gm_2$ is the total small-signal transconductance of PMOS transistor 225 and NMOS transistor 226 at the trip point/bias point:

$$Z_T = \frac{A_1 R_1}{1+A_1} g_{m2} \frac{A_3 R_2}{1+A_3} \quad \text{Equation 1}$$

$$Z_{in} = \frac{R_1}{1+A_1} \quad \text{Equation 2}$$

In one example, the common-mode/DC voltage component of TIA output node 294 is obtained via low-pass filter 230 and provided at node 293 ($V_{cm}$). The common mode voltage from node 293 may also be provided to a common mode logic (CML) buffer (not shown in FIG. 2) to convert the single-ended signal at TIA output node 294 into a differential signal. In one example, the cutoff frequency of the low-pass filter 230, e.g., a resistor-capacitor (RC) filter, may be set to 150 kilohertz (kHz). Resistances $R_1$ and $R_2$ may be in the range of 200 ohms, but may also be larger, such as 400-500 ohms or more. In one example, the cutoff frequency determines how long of a pseudo-random bit sequence (PRBS) the device can support. In one example, low-frequency equalizers and/or baseline wanderer circuits may alternatively or additionally be used to support longer run length data patterns.

In one example, a differential transconductance stage, e.g., operational amplifier 240, is to amplify the difference between the common-mode voltage at node 293 and a reference voltage 295 to produce an offset correction current that is fed to TIA input node 292. In other words, the low-pass filter 230 and the operational amplifier 240 may comprise an "offset correction circuit" or "offset cancellation circuit," In one example, the reference voltage 295 may comprise half the supply voltage (e.g., from voltage supply 203). To illustrate, in one example, if a supply voltage is 1 volt, device 200 may operate with a DC bias of 0.5 volts, and with input currents generating a small peak-to-peak voltage swing at the first stage inverter. For example, the input voltage swing (peak-to-peak) may be less than 50 millivolts (mV). In this range, the inverter stages may comprise analog amplifiers (with an inversion of polarity) operating in the saturation region. By biasing around the transistor trip point voltage, small input signals may still receive amplification. However, wherein input signals exceed 300 microamperes peak-to-peak, this may correspond to voltages that may drive inverter stages 221, 224, and 227 into the triode region. In addition, if the DC bias at input node 292 is amplified through the TIA unit 120 without correction, the DC bias may increase from 0.5 volts to 0.7 volts, and so forth, thus driving the second and third inverter stages 224 and 227 into the triode region.

As mentioned above, in one example the reference voltage 295 may comprise one half of the supply voltage 203. Since the reference voltage 295 is generally different than the signal at node 293 (the common mode voltage), the operational amplifier 240 may subtract the average current from the input node 292 (the DC current portion of the photocurrent from photodiode 210) by taking the average current to ground through a transistor in the operational amplifier 240. In other words, AC current will flow from the input node 292 across resistor 281, while the average current (DC current) will be subtracted via the operational amplifier 240. The desired DC bias may then be maintained across the gates of transistors 222, 223, and so forth.

Figure 3:
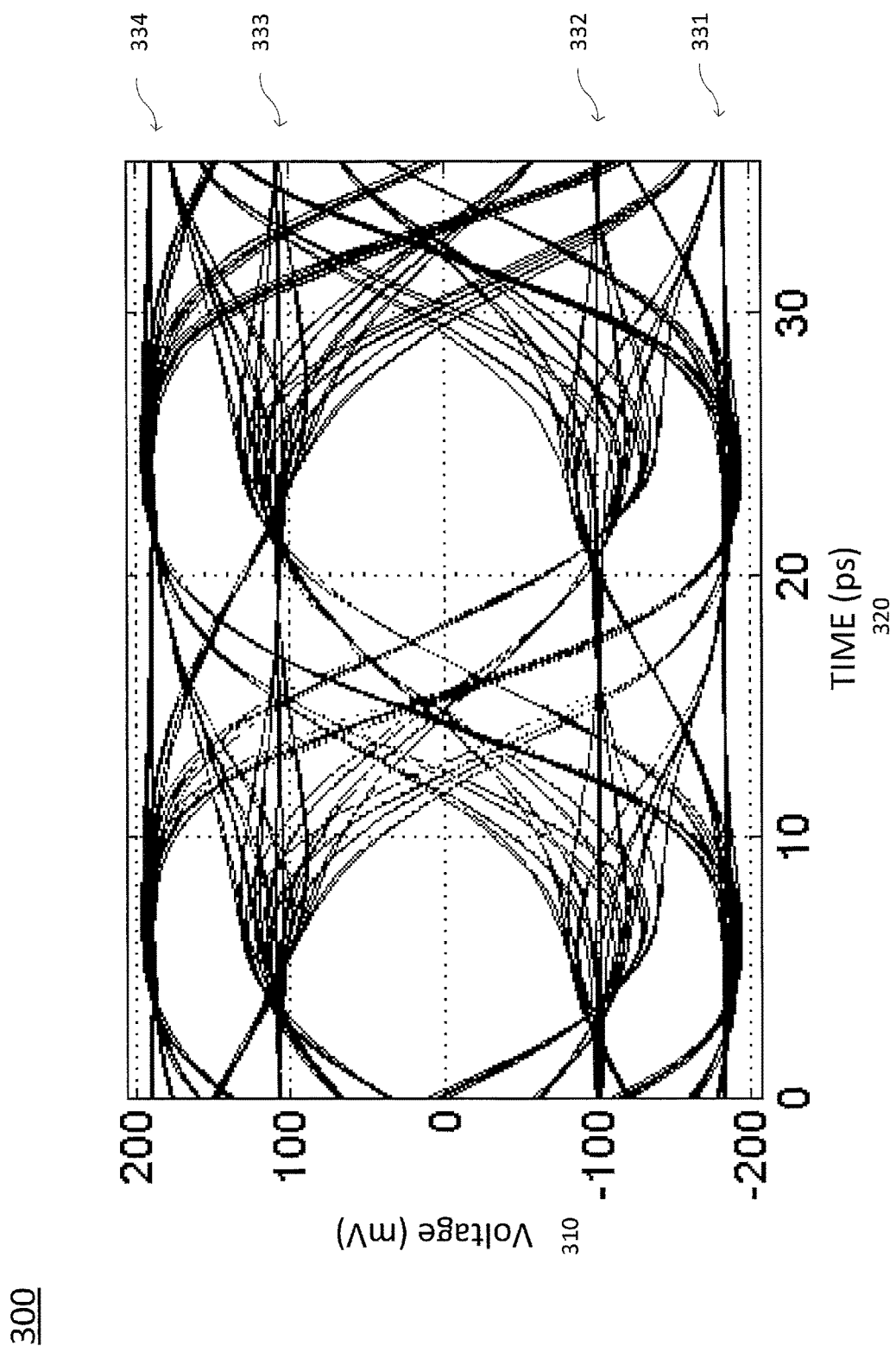
FIG. 3 illustrates a graph of an example eye diagram of an output of a receiver analog front-end in the absence of automatic gain control of the present disclosure.

As mentioned above, for high-input current signals, the second or third inverter stages of device 100 of FIG. 1 and circuit 200 of FIG. 2 may be driven into the deep triode region, or into the saturation region, which can result in distorted signals and overload-induced data jitter at the output of the front-end circuit, e.g., at output ports 198 and 199 of device 100. An example of the distorted eye diagram is shown in the graph 300 of FIG. 3. Graph 300 includes a first axis 310 representing peak-to-peak voltage in millivolts (mV) and a second axis 320 representing time in picoseconds (ps). In one example, the graph 300 may represent an input signal of 250 microamperes (uA) peak-to-peak using four-level encoding without automatic gain control of the present disclosure. In one example, signal levels 331-334 may represent the binary symbols 00, 01, 10, and 11, respectively. As can be seen in graph 300, there is distortion in the signal levels 331-334. In multi-level encoding, such as PAM-4, distortion makes it difficult for the back-end circuits to set threshold voltages to convert the multiple level signals back to NRZ signals and deteriorates the bit-error-rate (BER) performance of the overall receiver system.

Figure 4:
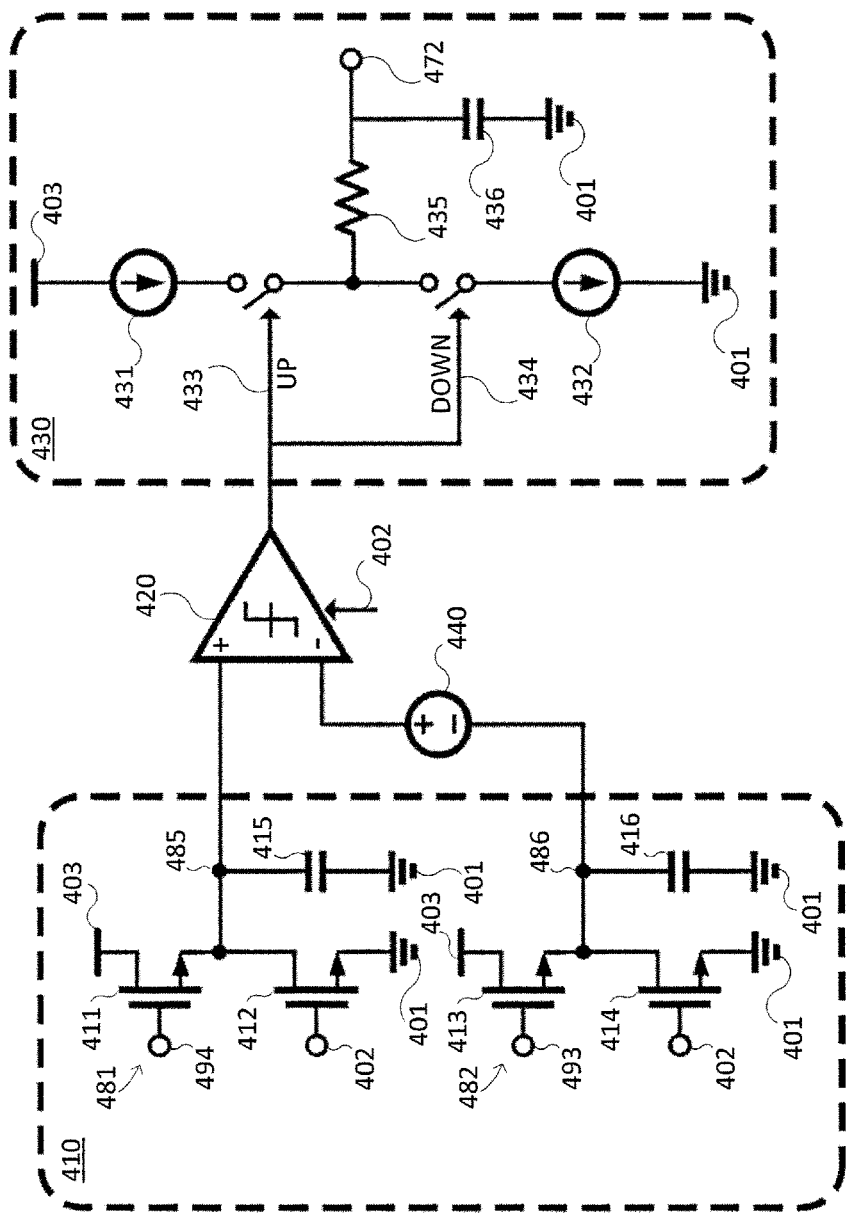
FIG. 4 illustrates an example device, or circuit of the present disclosure, e.g., an automatic gain control circuit, or peak detector circuit.

FIG. 4 illustrates an example circuit 400 of the present disclosure, e.g., an automatic gain control (AGC) circuit. In one example, the circuit 400 may comprise at least portion of the device 100 of FIG. 1. For instance, circuit 400 may represent a more detailed depiction of automatic gain control circuit 170 of FIG. 1. As illustrated in FIG. 4, circuit 400 includes a peak detector unit 410, a voltage level shifter 440, a comparator unit 420, and an integrator unit 430. In one example, the circuit 400 may be used to mitigate the distortion when the input current is above a predetermined threshold level by adjusting the feedback resistance in one of the inverter stages, e.g., as in FIGS. 1 and 2. For example, automatic gain control may comprise turning transistor 271 in FIG. 2 "on" for low-gain amplification and turning transistor 271 "off" for high-gain operation.

As illustrated in FIG. 4, peak detector unit 410 receives a transimpedance amplifier (TIA) unit output signal 494, a common mode voltage signal 493, and a clock signal 402. In one example, TIA unit output signal 494 may correspond to the signal at TIA output node 194 of FIG. 1 or TIA output node 294 of FIG. 2, and common mode voltage signal ($V_m$) 493 may correspond to the signal at node 193 of FIG. 1 or node 293 of FIG. 2.

In one example, peak detector unit 410 includes four n-type transistors 411-414 and two capacitors 415 and 418. These components are connected to voltage supply 403 and ground 401, and arranged as shown in FIG. 4. For example, as illustrated in FIG. 4: a drain of transistor 411 is connected to the supply voltage 403, a gate of transistor 411 is controlled by TIA unit output signal 494, a source of transistor 411 is connected to a drain of transistor 412 in series, a gate of transistor 412 is controlled by the clock signal 402, and a source of transistor 412 is connected to ground 401. Capacitor 415 is arranged in parallel with transistor 412. As also illustrated in FIG. 4: a drain of transistor 413 is connected to the supply voltage 403, a gate of transistor 413 is controlled by the common mode voltage signal 493, a drain of transistor 414 is connected to a source of transistor 413 in series, a gate of transistor 414 is controlled by the clock signal 402, and a source of transistor 414 is connected to ground 401. Capacitor 416 is arranged in parallel with transistor 414.

In one example, transistor 411, transistor 412, and capacitor 415 function as a first source follower peak detector 481, while transistor 413, transistor 414, and capacitor 416 function as a second source follower peak detector 482. For instance, peak detector 481 may detect peaks in the TIA output signal 494, while peak detector 482 detects peaks in the common mode voltage signal 493. It should be noted that the common mode voltage signal 493 may not typically exhibit strong peaking. Introducing peak detector 482 may guarantee that the common mode voltage signal 493 experiences the same gate-to-source voltage drop as the peak of the TIA unit output signal 494 experiences when it was stored at capacitor 415.

The output of the peak detector 481 at node 485 and the output of the peak detector 482 at node 486 comprise positive and negative inputs, respectively to the comparator 420. Comparator 420 may comprise a clock-driven strong-arm sensor amplifier with a set-reset (SR) latch, and may therefore receive clock signal 402 as an additional input. In one example, an offset voltage is added to the signal at node 486 via voltage level shifter 440. For example, the negative input to comparator 420 may comprise a smoothed version of the common mode voltage 493 at node 486 plus a voltage corresponding to one half of the desired maximum peak-to-peak voltage swing of the TIA unit output signal 494. An output of comparator 420 controls integrator unit 430. Integrator unit 430 may comprise a charge pump including current sources 431 and 432 between supply voltage 403 and ground 401, up switch 433, and down switch 434. In one example, up switch 433 and down switch 434 may collectively be referred to as a voltage-controlled switch. The control of the up switch 433 and down switch 434 causes the charging or discharging of an RC integrator, e.g., resistor 435 and capacitor 436 arranged as shown in FIG. 4. For example, with the up switch 433 turned on, voltage source 403 may charge capacitor 436. With the down switch 434 turned on, the capacitor 436 may discharge to ground 401.

In one example, the final integrated output at node 472 is connected to the gate of transistor 271 in FIG. 2 for gain control. To illustrate, if the voltage at TIA output node 294 in FIG. 2 is larger than the common mode voltage at node 293 plus the one half the desired peak-to-peak voltage swing, or voltage offset, the comparator 420 in FIG. 4 may output a low voltage, turning on the up switch 433 and turning off the down switch 434. In this charging process, the voltage at node 472 increases. This increasing voltage is applied to the gate of transistor 271 in FIG. 2, thereby turning transistor 271 "on." The transistor 271 will therefore appear as an additional resistance in parallel to resistor 282, and decrease the gain of inverter unit 227. The overall gain from the input node 292 in FIG. 2 to the TIA output node 294 will also decrease.

It should be appreciated that the foregoing description in connection with the devices and circuits of FIGS. 1, 2, and 4 is provided for illustrative purposes and that other, further and, different examples may be implemented in the same or in similar systems. For instance, additional inverter stages may be included in a multi-stage transimpedance amplifier unit of the present disclosure, additional common mode logic buffers may be included, and so forth. Likewise, resistors may be implemented as multiple resistors in series, transistor 271, and/or transistor 271 and resistor 282 may instead be implemented as a tunable resistor, and other modifications of a similar nature may be made in accordance with the present disclosure. It should also be noted that the scale of various components, such as the resistor impedances, the trip point voltages of transistor components, the input current ranges, the output voltage ranges, the supply voltage, the DC bias voltages, and other features are provided by way of example. In addition, although examples of the present disclosure provide advantages when used in connection with PAM-4 input optical signals, the examples of the present disclosure are broadly applicable to other multi-level intensity modulation schemes as well as to two-level intensity modulation schemes. For instance, examples of the present disclosure may provide similar advantages in accommodating NRZ-OOK signals and the like with wide peak-to-peak optical power levels (or intensities). Thus, the present disclosure is not limited to any particular dimensions or operating parameters. In addition, variants of the above-disclosed and other features and functions, or alternatives thereof, may be omitted, or may be combined or altered into many other different systems or applications.

Figure 5:
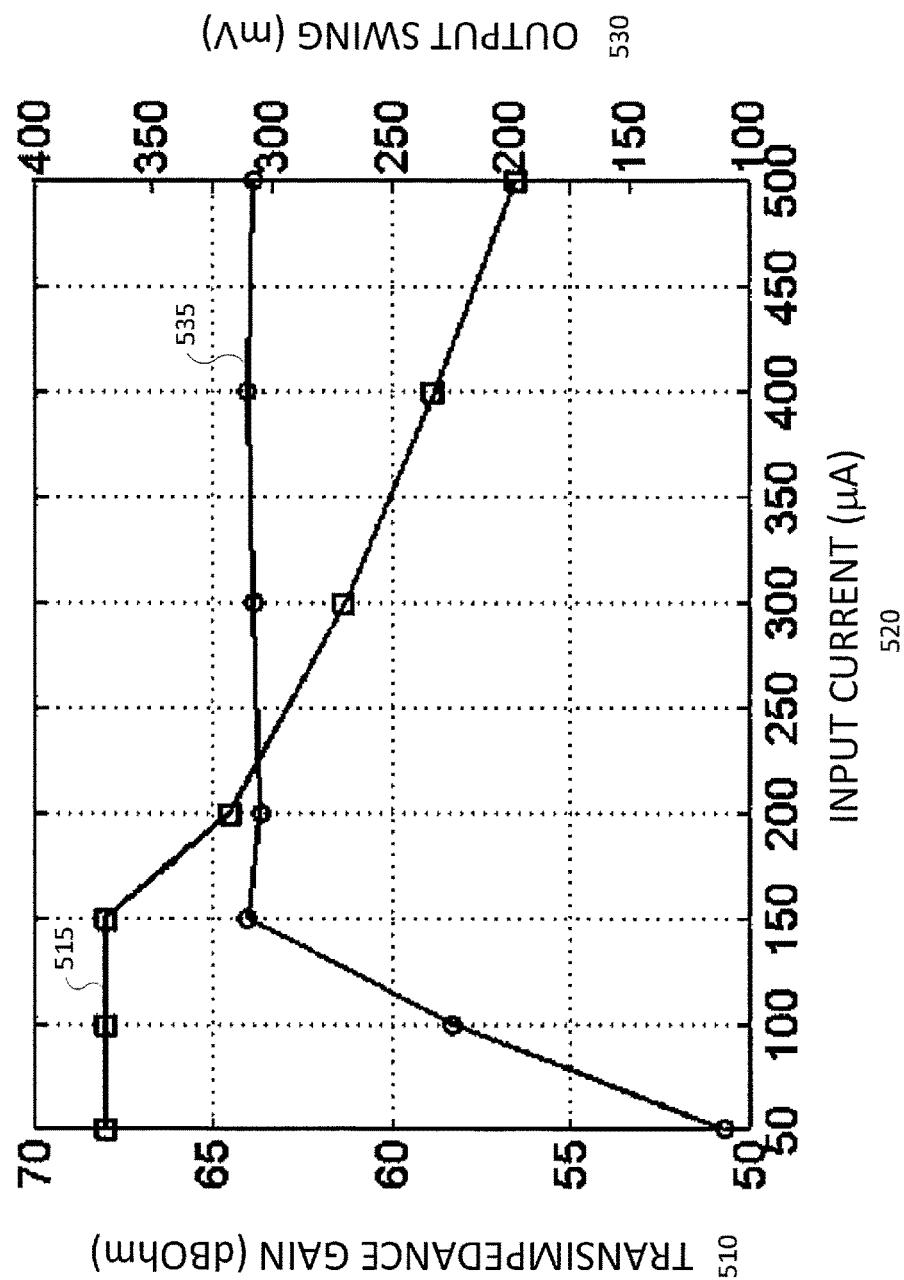
FIG. 5 illustrates an example graph plotting transimpedance gain versus input current, and output voltage swing versus input current of an example device of the present disclosure.

FIG. 5 illustrates an example graph 500 depicting both transimpedance gain versus input current, and output voltage swing versus input current for an example device of the present disclosure. A first axis 510 represents the transimpedance gain in decibel-ohms (dBOhm) and a second axis 520 represents the input current in micro-amperes. The plot 515 therefore shows the transimpedance gain versus input current in reference to axis 510 and axis 520. In one example, plot 515 may represent the gain as seen at the TIA output node 194 in FIG. 1 or TIA output node 294 in FIG. 2, respectively. As can be seen in FIG. 5, the transimpedance gain begins to taper in a linear manner when the input current exceeds 150 micro-amperes. This may correspond to the automatic gain control of the present disclosure being turned on. For instance, the transition at 150 microamperes in the plot 515 may correspond to transistor 271 in FIG. 2 being turned "on" and reducing the gain of inverter stage 227. The plot 535 is in reference to axis 520 and axis 530, and illustrates that the output swing may be maintained at approximately 300 millivolts when automatic gain control is activated. In one example, plot 535 may represent the peak-to-peak voltage as seen across the positive and negative output ports 198 and 199 of the device 100 in FIG. 1.

FIG. 6 illustrates a flowchart of an example method 600 for processing an optical signal. The method 600 may be performed, for example, by any one of the components illustrated in FIG. 1, 2, or 4. For instance, the method 600 may be performed by device 100 of FIG. 1, circuit 200 of FIG. 2, circuit 400 of FIG. 4, and/or any combination of components thereof. Although any of the elements in FIG. 1, 2, or 4, or in a similar system, may perform various blocks of the method 600, the method will now be described in terms of an example where blocks of the method are performed by a device, such as device 100 of FIG. 1.

The method 600 begins in block 605 and proceeds to block 610. In block 610, the device converts an optical signal to an electrical signal via a photodetector. In one example, the optical signal may be a multi-level intensity modulated signal. In one example, the current levels of the electrical signal may range from zero to 150 micro-amperes, but may in some cases exceed this range and be driven up to 500 micro-amperes or more.

In block 620, the device amplifies the electrical signal with a linear gain throughout a current range of the electrical signal. In one example, the amplification is performed via a transimpedance amplifier unit that receives the electrical signal as an input, and outputs a single-ended voltage signal that is proportional to the current value of the input electrical signal. In one example, the transimpedance amplifier unit comprises at least three inverter units. Thus, in one example, the transimpedance amplifier unit may comprise a multi-stage transimpedance amplifier unit. Each inverter unit, or "stage," may comprise a complementary pair of transistors, e.g., a p-type transistor and an n-type transistor. In one example, the first and third inverter units may include feedback resistors. At least one of the inverter units may include an n-type transistor in parallel with a feedback resistor for providing a variable gain to the inverter unit. The transimpedance amplifier unit may take the form of transimpedance amplifier unit 120 of FIG. 1 or the three inverter stages 221, 224, and 227 of FIG. 2.

In one example, block 620 may further comprise reducing a gain of at least one of the at least three inverter units in response to a voltage of the output of the transimpedance amplifier unit exceeding a common mode voltage of the transimpedance amplifier unit plus a voltage offset. In one example, the voltage offset may comprise one half of a desired peak-to-peak voltage variation of the output of the transimpedance amplifier unit. For instance, if the desired peak-to-peak voltage is 1 volt, the voltage offset may be set to 0.5 volts. In one example, the gain is reduced via a control signal to a transistor in parallel to a feedback resistor of the at least one of the at least three inverter units. In one example, the control signal is generated via an automatic gain control circuit of the device, which may take the form of automatic gain control circuit 170 of FIG. 1 and/or the circuit 400 of FIG. 4.

In block 630, the device filters a common mode voltage component of an output of the transimpedance amplifier unit. In one example, a low-pass filter may be used to perform the filtering. For example, the low-pass filter may take the form of low-pass filter 131 in FIG. 1 or low-pass filter 230 in FIG. 2. In one example, a cutoff frequency of the low-pass filter may be set to 150 KHz, or a different value, such that the output of the low-pass filter may comprise a common-mode (DC) voltage portion of the output of the transimpedance amplifier unit.

In block 640, the device corrects a direct current component of the electrical signal at an input of the transimpedance amplifier unit. In one example, the correction of the direct current component of the electrical signal may comprise comparing the output of the transimpedance amplifier unit to a reference voltage, which may comprise a desired DC bias. In one example, the comparing may be performed via an operational amplifier functioning as a comparator. The operational amplifier may take the form of operational amplifier 135 in FIG. 1 or operational amplifier 240 in FIG. 2. In one example, a positive input of the operational amplifier is for the output of the low-pass filter, e.g., the common mode voltage component of the output of the transimpedance amplifier unit, and a negative input of the operational amplifier is for the reference voltage. As mentioned above, in one example, the reference voltage may comprise one half of the supply voltage.

In one example, the reference voltage is expected to be larger than the common mode voltage. As such, at block 640 the operational amplifier may subtract the average current from electrical signal that is input to the transimpedance amplifier unit, e.g., the DC current portion of the photocurrent from photodiode. In one example, the average current is taken to ground through a transistor in the operational amplifier such that only the alternating current portion of the electrical signal at a desired DC bias is input to the transimpedance amplifier unit.

Following block 640, the method 600 proceeds block 696 where the method ends.

It will also be appreciated that variants of the above-disclosed and other features and functions, or alternatives thereof, may be combined into many other different systems or applications. Various presently unforeseen or unanticipated alternatives, modifications, or variations therein may be subsequently made, which are also intended to be encompassed by the following claims.

What is claimed is:

1. A device, comprising:
a photodetector to generate an electrical signal in response to an optical signal;
a transimpedance amplifier unit to receive the electrical signal, wherein the transimpedance amplifier unit comprises:
a first inverter unit;
a second inverter unit coupled to the first inverter unit; and
a third inverter unit coupled to the second inverter unit, wherein the third inverter unit comprises:
a feedback resistor; and
a first n-type transistor in parallel to the feedback resistor, wherein the first n-type transistor is to provide a variable gain of the third inverter unit;
a low-pass filter coupled to the transimpedance amplifier unit to provide a direct current component of an output of the transimpedance amplifier unit;
at least one current-mode logic buffer to receive an output of the transimpedance amplifier unit and to receive the direct current component of the output of the transimpedance amplifier unit from the low-pass filter; and
a continuous time linear equalization unit to receive an output of the current-mode logic buffer.

2. The device of claim 1, wherein each of the first inverter unit, the second inverter unit, and the third inverter unit comprises a pair of complementary transistors.

3. The device of claim 1, wherein the first inverter unit includes a second feedback resistor.

4. The device of claim 1, further comprising:
an operational amplifier coupled to the low pass filter and to the transimpedance amplifier unit, to provide a correction current to an input of the transimpedance amplifier unit based upon a voltage difference between the direct current component of the output of the transimpedance amplifier unit and a reference voltage.

5. A device, comprising:
a photodetector to generate an electrical signal in response to an optical signal;
a transimpedance amplifier unit to receive the electrical signal, wherein the transimpedance amplifier unit comprises:
a first inverter unit;
a second inverter unit coupled to the first inverter unit; and
a third inverter unit coupled to the second inverter unit, wherein the third inverter unit comprises:
a feedback resistor; and
a first n-type transistor in parallel to the feedback resistor, wherein the first n-type transistor is to provide a variable gain of the third inverter unit;
an automatic gain control circuit coupled to the transimpedance amplifier unit to control the variable gain of the third inverter unit, wherein the automatic gain control circuit comprises:
a peak detector unit, wherein the peak detector unit comprises:
a second n-type transistor, wherein a gate of the second n-type transistor is controlled by an output of the transimpedance amplifier unit; and a third n-type transistor in series with the second n-type transistor, wherein a gate of the third n-type transistor is controlled by a clock signal;
a first capacitor in parallel with the third n-type transistor;
a fourth n-type transistor, wherein a gate of the fourth n-type transistor is controlled by a direct current component of the output of the transimpedance amplifier unit;
a fifth n-type transistor in series with the fourth n-type transistor, wherein a gate of the fifth n-type transistor is controlled by the clock signal; and
a second capacitor in parallel with the fifth n-type transistor;
a comparator unit coupled to the peak detector unit; and
an integrator coupled to the comparator unit.

6. The device of claim 5, wherein the comparator unit comprises:
an operational amplifier, wherein a positive input to the operational amplifier comprises a peak-value signal derived from an output of the transimpedance amplifier unit, and wherein a negative input to the operational amplifier comprises a sum of a direct current component of the output of the transimpedance amplifier unit and an offset voltage, wherein the offset voltage comprises half of a peak-to-peak voltage of the output of the transimpedance amplifier unit.

7. The device of claim 5, wherein an output of the integrator unit is to control a gate of the first n-type transistor to provide the variable gain of the third inverter unit.

8. The device of claim 5, wherein the integrator unit comprises:
a voltage-controlled switch, controlled by an output of the comparator unit;
a charge pump comprising a pair of current sources in series with the voltage-controlled switch; and
a resistor-capacitor integrator coupled to an output of the charge pump.

9. A device, comprising:
a photodetector to receive an optical signal and to convert the optical signal to an electrical signal;
a transimpedance amplifier unit to amplify the electrical signal with a linear gain throughout a current range of the electrical signal, wherein the transimpedance amplifier unit comprises at least three inverter units;
an offset correction circuit coupled to the transimpedance amplifier unit, to correct a direct current component of the electrical signal; and
an automatic gain control circuit coupled to the transimpedance amplifier unit, to control a variable gain of at least one of the at least three inverter units of the transimpedance amplifier unit and to prevent the at least three inverter units of the transimpedance amplifier unit from operating in a saturation region, wherein the automatic gain control circuit comprises:
a peak detector unit;
a comparator unit coupled to the peak detector unit; and
an integrator coupled to the comparator unit, wherein the peak detector unit comprises:
a second n-type transistor, wherein a gate of the second n-type transistor is controlled by an output of the transimpedance amplifier unit; and
a third n-type transistor in series with the second n-type transistor, wherein a gate of the third n-type transistor is controlled by a clock signal;
a first capacitor in parallel with the third n-type transistor;
a fourth n-type transistor, wherein a gate of the fourth n-type transistor is controlled by a direct current component of the output of the transimpedance amplifier unit;
a fifth n-type transistor in series with the fourth n-type transistor, wherein a gate of the fifth n-type transistor is controlled by the clock signal; and
a second capacitor in parallel with the fifth n-type transistor.

10. The device of claim 9, wherein the automatic gain control circuit is to control a gate of a transistor in parallel with a feedback resistor of one of the at least three inverters.

* * * * *